United States Patent [19]

Caspell

[11] Patent Number: 4,825,100
[45] Date of Patent: Apr. 25, 1989

[54] HIGH SPEED R-S LATCH

[75] Inventor: George J. Caspell, Hillsboro, Oreg.

[73] Assignee: Tektronix, Inc., Beaverton, Oreg.

[21] Appl. No.: 177,556

[22] Filed: Apr. 4, 1988

[51] Int. Cl.[4] ............................................. H03K 3/356
[52] U.S. Cl. .................................... 307/279; 307/491; 307/494
[58] Field of Search ............... 307/493, 530, 491, 494, 307/279

[56] References Cited

U.S. PATENT DOCUMENTS 4,654,547 3/1987 Shaver ................................ 307/279

FOREIGN PATENT DOCUMENTS 0109028 8/1980 Japan ................................ 307/279

OTHER PUBLICATIONS

W. B. Chin et al., "Cmplementary MOS Set/Reset Latch" IBM Tech. Discl. Bul. vol. 15, No. 9, Feb. 1973, p. 2918.

Primary Examiner—John Zazworsky
Attorney, Agent, or Firm—Peter J. Meza

[57] ABSTRACT

According to the present invention, an R-S latch includes an input stage, a double gate latch stage, and an output stage. The input stage includes a pair of source couplet FETs, a pair of active loads, and a biasing current source. The output of the input stage is coupled to both the latch stage and the output stage, which contains a pair of source follower FETs. The latch stage includes a pair of source coupled double gate FETs. The latch stage provides the switching or latching mechanism which prevents the outputs from changing logic stage until an appropriate set or reset pulse is received. However, one pair of the gates in the latch stage are coupled to an inverted set and reset input. This pair of additional gates enables the Q and $\overline{Q}$ output to switch symmetrically, thus preventing delay between the Q and $\overline{Q}$ output.

8 Claims, 2 Drawing Sheets

HIGH SPEED R-S LATCH

BACKGROUND OF THE INVENTION

This invention is in the field of logic latches or flip-flops and more specifically to high speed R-S (reset, set) latches.

The operation of R-S latches is well understood in the art. The output of the latch remains in a predetermined logic state until an appropriate set or reset pulse appears at the corresponding input. In "Introduction to Switching Theory and Logical Design" (2nd Ed., John Wiley & Sons, 1974), the authors, Fredrick J. Hill and Gerald R. Peterson have described the operation of an R-S latch. "A pulse on the S [set] input will 'Set' the flip-flop—that is, drive the Q output to the 1 level and the $\overline{Q}$ output to the 0 level. A pulse on the C [reset] line will 'Clear' (Reset) the flip-flop—that is, drive the Q output to the 0 level and the $\overline{Q}$ output to the 1 level." p. 214

One typical prior art R-S latch design is shown in FIG. 1. The schematic has been simplified for ease of analysis. The prior art R-S latch includes an input stage consisting of FETs 14 and 16 which are biased by current source 18. The drains of the input FETs are coupled to load impedances 10 and 12, which are shown as resistors. A differential voltage is developed across the drains of FETs 14 and 16. The R-S latch further contains a latch stage consisting of FETs 20 and 22, and an output stage consisting of FETs 24 and 26, which are biased by current sources 19 and 21.

Assuming that the prior art R-S latch is in the set mode, the Q output will be high or at a logic 1 state, and the $\overline{Q}$ output will be low or at a logic 0 state. A reset pulse is now required to switch the states of the outputs. A reset pulse will cause FET 14 to conduct which will cause the voltage at the drain of FET 14 to decrease. The output stage, which includes FET 24, which is biased in a source follower configuration, will simply track this decreasing voltage. Thus, the Q output of the R-S latch will closely track the reset pulse.

The analysis of the $\overline{Q}$ output is quite different. The $\overline{Q}$ output cannot change state until the Q output has substantially reached a logic 0 state, in which case the latch stage will switch. Only after the latch stage has switched, will the voltage at the gate of FET 26, and consequently the $\overline{Q}$ output, reach a logic 1 level. Put another way, as FET 14 begins to conduct, it alone causes the Q output to start changing logic state. After the delay from the R input to the Q output has propagated, then FETs 20 and 22 assist in the switching action, thus speeding up the transition. If the resistive loads 10 and 12 had been active loads with appropriate clamping circuitry, then the $\overline{Q}$ output would not begin changing logic state until the clamping circuit had ceased clamping due to the reduced current flowing through FET 20. At that time, however, the Q output would be well into the downward transition to a logic 0 level.

The response of the prior art R-S latch to a reset pulse is shown in FIG. 2. It may be easily seen that the Q output switches first, whereas a finite delay exists until the $\overline{Q}$ output switches.

In high speed logic circuits, delays between the Q output and $\overline{Q}$ output are undesirable for the very fact that extra delay in such circuits necessarily decreases maximum frequency of operation. Also, the delay may cause undesirable race conditions and unnecessarily complicates system design.

Therefore, what is desired is an R-S latch that does not have a delay between the Q and $\overline{Q}$ outputs, but switches logic states symmetrically, and at high speeds.

SUMMARY OF THE INVENTION

According to the present invention, an R-S latch includes an input stage, a double gate latch stage, and an output stage. The input stage includes a pair of source coupled FETs, a pair of active loads, and a biasing current source. The output of the input stage is coupled to both the latch stage and the output stage, which contains a pair of source follower FETs. The latch stage includes a pair of source coupled double gate FETs. The latch stage provides the switching or latching mechanism which prevents the outputs from changing logic state until an appropriate set or reset pulse is received. However, one pair of the gates in the latch stage is coupled to an inverted set and reset input. This pair of additional gates enables the Q and $\overline{Q}$ output to switch symmetrically, thus preventing delay between the Q and $\overline{Q}$ output In a preferred embodiment, active loads and current sources are provided by a single FET in which the gate and source are coupled together. Also, the input stage includes a pair of clamping circuits which include a diode and an FET whose gate is coupled to a reference voltage. The clamping circuits prevent the input FETs from saturating.

Circuit analysis shows, and computer simulations confirm, that the R-S latch according to the present invention provides fast and symmetrical switching at the Q and $\overline{Q}$ outputs.

DESCRIPTION OF THE PREFERRED EMBODIMENT

Figure 1:
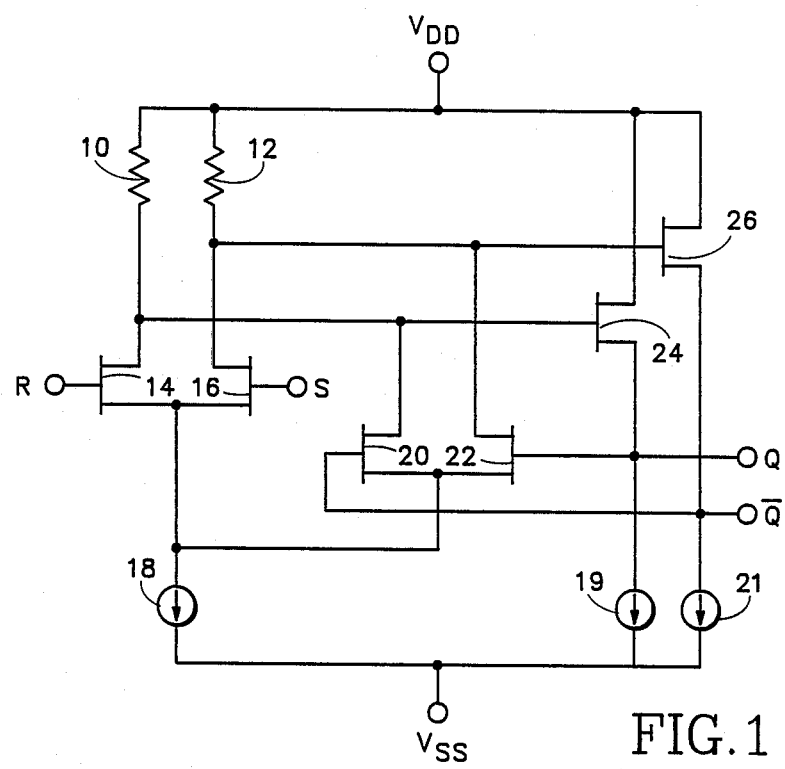
FIG. 1 is a simplified schematic diagram of a prior art -R-S latch circuit.
Figure 2:
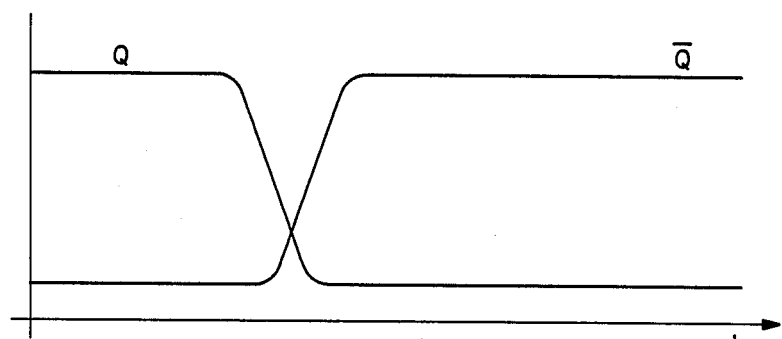
FIG. 2 is a plot of the switching characteristics of the prior art R-S latch circuit.
Figure 3:
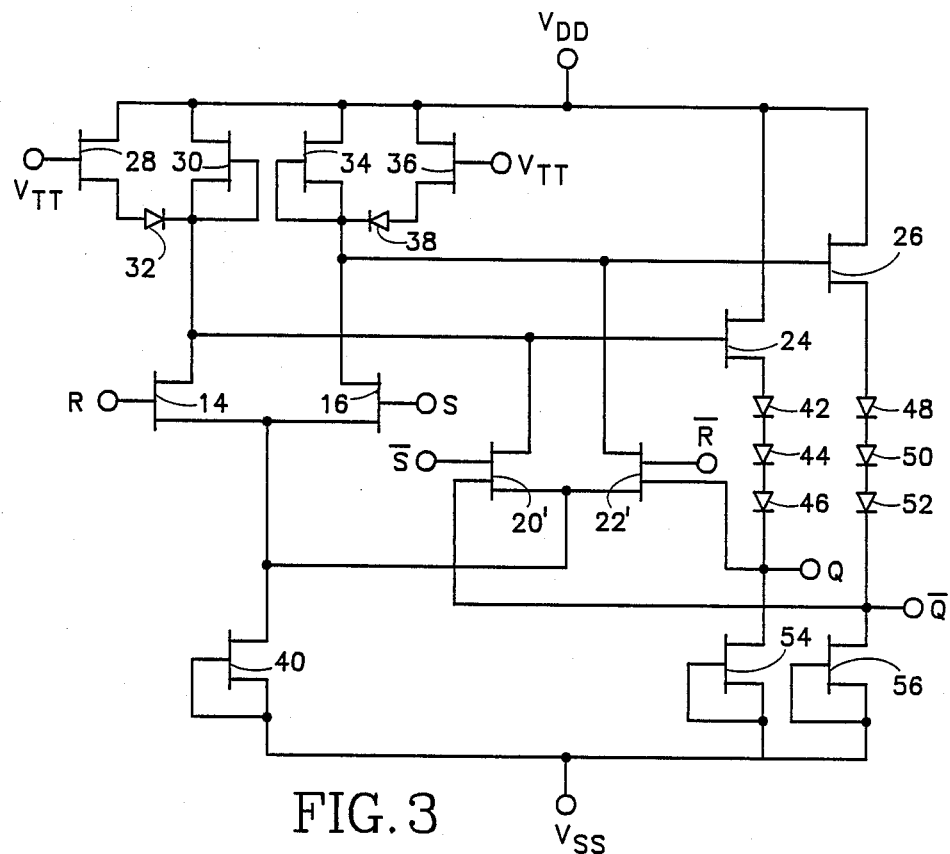
FIG. 3 is a schematic diagram of the preferred embodiment of the R-S latch according to the present invention.

The preferred embodiment of the R-S latch circuit is shown in FIG. 3 and includes an input stage, including FETs 14, 16, 28, 30, 34, 36 and 40, diodes 32 and 38, a latch stage including double gated FETs 20' and 22', and an output stage including FETs 24, 26, 54, and 56, and diodes 42, 44, 46, 48, 50 and 52. The inputs include reset (R) and set (S) inputs which are coupled to the gate of FETs 14 and 16 in the input stage, and $\overline{R}$ and $\overline{R}$ inputs which are coupled to FETs 20' and 22' in the double gate latch stage. Outputs are Q and $\overline{Q}$ which are developed at the cathode of diodes 46 and 52, respectively, in the output stage.

The input stage is of conventional design, with FETs 14 and 16 forming the source coupled input pair. The input pair is biased by FET 40, in which the gate and source are coupled to provide a constant current source. Similarly, active loads are provided by FETs 30 and 34, in which respective gates and sources are coupled. Clamping circuits are provided which prevent the voltage on the drains of FETs 14 and 16 from decreasing beyond a predetermined value thus preventing saturation. The clamping value is determined by the reference voltage $V_{TT}$, the gate to source voltage ($V_{GS}$) of FETs 28 and 36, and the forward drop across diodes 32 and 38.

The output stage is also of conventional design and includes FETs 24 and 26 which are used in a source follower configuration. In series with the source of both FETs 24 and 26 are three series diodes 42, 44, and 46, and 48, 50, and 52, respectively. These diodes are used as a level shifter to provide proper biasing levels. The source follower FETs and the level shifting diodes are biased through constant current source FETs 54 and 56.

The intermediate stage is the latch stage which consists of double gate FET 20' and 22'. Each double gate FET is constructed such that both gates must be energized before conduction between drain and source can occur. Double gate devices 20' and 22' are source coupled and provide a current steering function, which in turn provides the "memory" of the latch which maintains the constant output level until an appropriate set or reset pulse is received. However, unlike a conventional design, the latch stage is not switched by the Q output, but directly, by the additional inverted R and S inputs.

In analyzing the actual switching operation of the R-S latch, it should be noted that the circuit is symmetrical with respect to the set and reset operations, therefore only the reset operation need be described. It is assumed that the set input is inactive during the reset operation. It should also be noted that R and S are active high logic signals, while the inverted inputs, $\overline{R}$ and $\overline{R}$, are active low logic signals. Therefore, the reset mode is activated by a positive going R signal and a negative going $\overline{R}$ signal.

Thus, a positive going R signal causes FET 14 to conduct, which in turn produces a logic low voltage at the drain of FET 14 which is tracked by source follower FET 24 resulting in a logic low level at the Q output. Simultaneously, the negative going $\overline{R}$ signal causes FET 22' to turn off, which in turn produces a logic high voltage at the drain of FET 22' which is tracked by source follower FET 26 resulting in a logic high level at the $\overline{Q}$ output. When the reset is terminated, the R pulse returns to a logic level 0, which turns off FET 14. Since $\overline{Q}$ and $\overline{S}$, are both high, double gate FET 20' conducts, which holds the drain and the Q output low. Similarly, $\overline{R}$ returns to a logic high level, double gate FET 22' remains off because the Q output is low, and both gates must be high for conduction to occur. Therefore the drain of FET 22' and the $\overline{Q}$ output remain high. It should also be noted that since S is in a logic 0 level, FET 16 is turned off, which also allows the $\overline{Q}$ output to remain high. The latch is now reset. The outputs remain in their respective logic states, as in a conventional R-S latch, until an appropriate set pulse is received.

Figure 4:
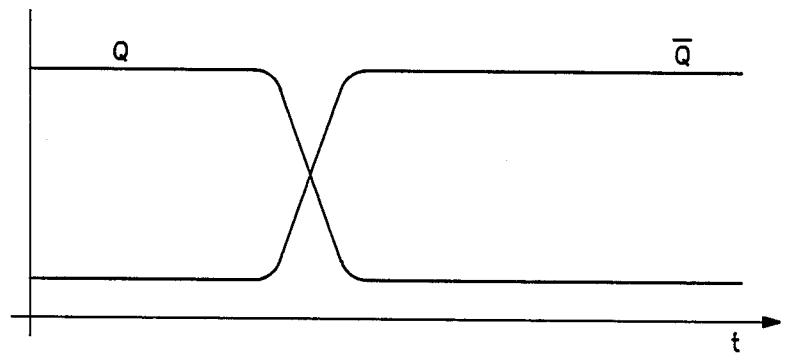
FIG. 4 is a plot of the switching characteristics of the R-S latch according to the present invention.

Thus, the present invention increases switching speeds by simultaneously switching FETs 14 and 22' which causes the outputs to switch without the additional delay of the Q output transition. This symmetrical switching characteristic of the R-S latch according to the present invention is illustrated in FIG. 4.

The design shown in FIG. 3 may be implemented with Gallium Arsenide FETs, or any other N-channel FET. Attention should be paid, however, to the biasing characteristics of the devices used in order that the correct level shifting and reference voltages are used. It is also apparent that the design may be implemented with P-channel FETs, but the entire design must be flipped and the polarity of the input signals reversed.

Thus, the present invention discloses a high speed R-S latch which provides high frequency performance, symmetrical switching of the Q and $\overline{Q}$ outputs, while retaining the normal logic functions of a conventional R-S latch.

While I have shown and described the preferred embodiment of my invention, it is apparent to those skilled in the art that many changes and modifications may be made without departing from the invention in its broader aspects. The appended claims therefore cover all such changes and modifications as fall therewithin.

I claim:

1. A high speed R-S latch comprising:
   a. an input stage having reset and set inputs, and a differential output;
   b. an output stage having a differential input, a differential output, the differential input being coupled to the differential output of said input stage; and
   c. a double gate FET latch stage having inverted reset and set inputs, a differential input, and a differential output, the differential input of said double gate FET latch stage being coupled to the differential output of said output stage, the differential output of said double gate FET latch stage being coupled to the differential output of said input stage.

2. A high speed R-S latch as in claim 1 wherein the input stage comprises a pair of FETs, each having a drain, a gate, and a source, the drains each being coupled to an active load, the gates forming the reset and set inputs, and the sources being coupled together and to a constant current source.

3. A high speed R-S latch as in claim 2 wherein the active loads each comprise an FET in which the gate and source are coupled together.

4. A high speed R-S latch as in claim 2 further comprising a clamping circuit coupled to each FET drain.

5. A high speed R-S latch as in claim 4 wherein the clamping circuit comprises a serially coupled diode and an FET, wherein the gate of the FET is coupled to a reference voltage source.

6. A high speed R-S latch as in claim 1, wherein said double gate latch stage comprises a pair of double gated FETs, each having first and second gates, a drain, and a source, the first gates forming the inverted reset and set inputs, the second gates forming the differential input, the drains forming the differential output and the sources being coupled together and to a constant current source.

7. A high speed R-S latch as in claim 1, wherein the output stage contains a pair of FETs each having a drain, a gate and a source, the drains being coupled to a supply voltage, the gates forming the differential input, the sources forming the differential output, and each source also being coupled to a constant current source.

8. A high speed R-S latch as in claim 7, wherein the output stage further comprises a level shifting diode in series relation with each FET source.

* * * * *